(12) United States Patent
Knox

(10) Patent No.: US 6,388,803 B1
(45) Date of Patent: May 14, 2002

(54) ARTICLE COMPRISING A BROAD BAND OPTICAL AMPLIFIER

(75) Inventor: Wayne H. Knox, Holmdel, NJ (US)

(73) Assignee: Agere Systems Guardian Corp., Berkeley Heights, NJ (US)

( * ) Notice: Subject to any disclaimer, the term of this patent is extended or adjusted under 35 U.S.C. 154(b) by 0 days.

(21) Appl. No.: 09/517,342

(22) Filed: Mar. 2, 2000

(51) Int. Cl.⁷ .................................................. H01S 3/00
(52) U.S. Cl. ................................. 359/337.1; 359/341.1
(58) Field of Search ................................. 359/130, 131, 359/170, 193, 341, 337, 349, 344, 563, 566, 641; 385/10, 37, 88, 9, 93

(56) References Cited

U.S. PATENT DOCUMENTS

| | | | | |
|---|---|---|---|---|
| 4,209,689 A | * | 6/1980 | Linford et al. | 455/609 |
| 4,328,576 A | * | 5/1982 | Oakley | 370/3 |
| 4,773,063 A | * | 9/1988 | Hunsperger et al. | 370/3 |
| 5,026,131 A | * | 6/1991 | Jannson et al. | 350/3.7 |
| 5,363,221 A | * | 11/1994 | Sutton et al. | 359/11 |
| 5,469,277 A | * | 11/1995 | Kavehrad et al. | 359/15 |
| 5,526,175 A | * | 6/1996 | Minelly et al. | 359/341 |
| 5,629,992 A | * | 5/1997 | Amersfoort et al. | 385/15 |
| 5,974,207 A | * | 10/1999 | Aksyuk et al. | 385/24 |
| 6,049,418 A | * | 4/2000 | Srivastava et al. | 359/341 |
| 6,192,058 B1 | * | 2/2001 | Abeles | 372/6 |
| 6,271,970 B1 | * | 8/2001 | Wade | 359/618 |
| 6,275,623 B1 | * | 8/2001 | Brophy et al. | 385/14 |

FOREIGN PATENT DOCUMENTS

| | | | | |
|---|---|---|---|---|
| EP | 1024541 A2 | * | 2/2000 | H01L/49/00 |
| GB | 2217870 A | * | 1/1989 | G02B/6/34 |

OTHER PUBLICATIONS

J. Hecht, 'Understanding Fiber Optics', 1993, pp. 165–171.*
Timofeev et al., "Free–space aberration–correctd grating demltiplexer for application in densely–spaced, subnanometre wavelenght–routed optical networks", Electronics Letters, 3$^{rd}$ Aug. 1995, pp. 1368–1370.*

* cited by examiner

Primary Examiner—Thomas H. Tarcza
Assistant Examiner—Deandra M. Hughes
(74) Attorney, Agent, or Firm—J. De La Rosa

(57) ABSTRACT

A broad band optical amplifier includes at least one free space wavelength demultiplexer/multiplexer and optical gain means. The free space demultiplexer/multiplexer receives a multiplexed signal and spatially separates it into a plurality of spectral components each having a unique peak wavelength. The optical gain means has a plurality of wavelength-selective gain regions that are capable of imparting gain to (i.e., amplifying) an optical signal over a particular narrow range of wavelengths. The operational range (i.e., the particular narrow range of wavelengths) of each gain region is unique. The spatially-separated spectral components are individually delivered to specific gain regions by the demultiplexer/multiplexer as a function of the peak wavelength of the spectral component and the operative range of the gain region.

15 Claims, 6 Drawing Sheets

ARTICLE COMPRISING A BROAD BAND OPTICAL AMPLIFIER

FIELD OF THE INVENTION

The present invention relates generally to optical communications networks. More particularly, the present invention relates to an optical amplifier with a very broad bandwidth and to optical communications networks incorporating the same.

BACKGROUND OF THE INVENTION

Wavelength-division-multiplexed (WDM) optical communications networks support the transmission of a number of different peak wavelength optical signals in parallel on a single optical fiber. Each one of such signals, typically referred to as a channel, represents an independent data stream.

FIG. 1 depicts a simplified schematic diagram of a typical WDM network 100 in the prior art. It will be clear to those skilled in the art that a typical WDM optical communications network will have many other elements than are depicted in FIG. 1. These other elements are not shown so that attention can be focused on those elements that are germane to an understanding of the present invention.

WDM network 100 includes a plurality of transmitters TX-1 through TX-n, each of which transmitters includes an optical source for generating an optical signal λ-i, i=1, n. Each optical signal λ-i has a unique peak wavelength onto which information is modulated in well-known fashion. The plurality of optical signals λ-1 through λ-n are combined into a single "multiplexed" signal m-λ by wavelength multiplexer 102 in known fashion. Multiplexed signal m-λ is then launched into optical fiber 104.

Nodes 106 and 108 are in optical communication with WDM network 100 and are operable to receive multiplexed signal m-λ. Such nodes comprise subscriber terminals (e.g., subscriber terminals 106-S1 and 108-S1, etc.) each having a receiver(s) (not shown) for receiving at least some of the information carried by multiplexed signal m-λ.

To provide the requisite information to an individual subscriber terminal, nodes 106 and 108 typically include a means for removing or separating the channel(s) carrying such information from the other channels of multiplexed signal m-λ. Depending on the size of the node (ie., the number of subscriber terminals, etc.), an add-drop filter (not shown) or a demultiplexer, such as demultiplexer 110, may suitably be used to remove one or more appropriate channels from multiplexed signal m-λ. The removed channel(s) are then delivered to the appropriate subscriber terminal(s).

Multiplexed signal m-λ is attenuated as it transmitted over the WDM network 100. Such attenuation is due, for example, to losses that occur as the signal propagates through waveguides (e.g., optical fiber 104) and as it passes through add-drop filters (not shown) or demultiplexers at network nodes. To compensate for signal attenuation, WDM network 100 includes in-line optical amplifiers 112 for supplying additional gain to multiplexed signal m-λ.

Optical amplifiers 112 for WDM networks are typically implemented as fiber amplifiers. In fiber amplifiers, an optical pump excites doping ions to a higher energy level from which amplification takes place by stimulated emission. The doping ions are rare-earth elements such as erbium, praseodymium, and neodynium. As an alternate to doping, amplification can also be provided using Raman scattering. In Raman scattering, a small portion of an incident frequency is converted into other frequencies. The effect can be used to transfer energy from a pump laser to a weak signal.

Rare-earth doped fiber amplifiers have an optical bandwidth of about 80 nanometers (nm) (at 15–30 dB gain) and Raman fiber amplifiers have an optical bandwidth of about 50 nm (at 10–15 dB gain). Such bandwidths may be acceptable in some systems, or may suitably be broadened piecewise as desired by combining several such amplifiers. But ultra-broadband continuous gain, such as will be necessary in future optical networks, cannot presently be obtained with fiber amplification.

Another way to implement an optical amplifier is as a semiconductor amplifier wherein gain is provided by stimulated emission from injected carriers. Semiconductor amplifiers are not, however, typically used in WDM systems because they induce cross-signal modulation by spectral hole burning and four-wave mixing. These effects can be avoided by separating the spectral components (i.e., the various wavelength signals) that comprise the multiplexed signal and directing them to different semiconductor amplifiers. Such separation has required the use of fiber devices (e.g., waveguide routers, etc.). The use of such devices increases signal attenuation and increases system cost.

The art would therefore benefit from an amplifier that provides ultra-broadband gain but avoids the drawbacks of the prior art.

SUMMARY OF THE INVENTION

An article comprising a broad band amplifier that avoids the drawbacks of the prior art is disclosed. In one embodiment, the broad band amplifier comprises a free-space wavelength demultiplexer/multiplexer and optical gain means.

The free-space wavelength demultiplexer/multiplexer is operable to receive a multiplexed signal and to demultiplex it into its constituent spectral components. Each such spectral component is characterized by a different peak wavelength. The free space wavelength demultiplexer/multiplexer(s) is advantageously implemented as a grating demultiplexer/multiplexer. In one embodiment, the grating demultiplexer/multiplexer is realized via an arrangement that includes collimating/focusing optics and a plane grating.

The optical gain means comprises a plurality of "wavelength-specific" gain regions. In the present context, the phrase "wavelength-specific" means that an individual gain region is operable to impart gain over a specific, narrow range of wavelengths. A given gain region is advantageously operable over a different wavelength range than all other gain regions. In some embodiments, the gain regions comprise semiconductor optical amplifiers.

In some embodiments of the present invention, the free-space wavelength demultiplexer/multiplexer is operable to deliver each spectral component, as a function of its wavelength, to the "corresponding" wavelength-specific gain region. In the present context, the term "corresponding" means that the delivered spectral component is characterized by a peak wavelength that is banded by the operating range of the gain region that receives that spectral component. As a consequence, the spectral components are amplified. Since spectral components are physically separate and are amplified in physically separate gain regions, the cross-signal modulation that is prevalent in prior art semiconductor optical amplifiers is avoided.

After amplification, the spectral components are re-multiplexed. In some embodiments, this is accomplished by reflecting the spectral components toward the free-space wavelength demultiplexer/multiplexer. In such a case, the path taken by the amplified spectral components through the free-space wavelength demultiplexer/multiplexer is the reverse of the path followed by the spectral components before amplification. As such, during the reverse pass, the free-space wavelength demultiplexer/multiplexer (re) multiplexes the spectral components.

In other embodiments, rather than reflecting the amplified spectral components to the free-space wavelength demultiplexer/multiplexer, they are delivered to a second free-space wavelength demultiplexer/multiplexer. The second free-space wavelength demultiplexer/multiplexer is operable to (re)multiplex the spectral components and launch the resulting multiplexed signal back into a waveguide for transmission through a WDM network. In both cases, with the exception of the imparted gain, the reconstituted version of the multiplexed signal is identical to the original un-amplified multiplexed signal.

DETAILED DESCRIPTION OF THE INVENTION

Figure 1:
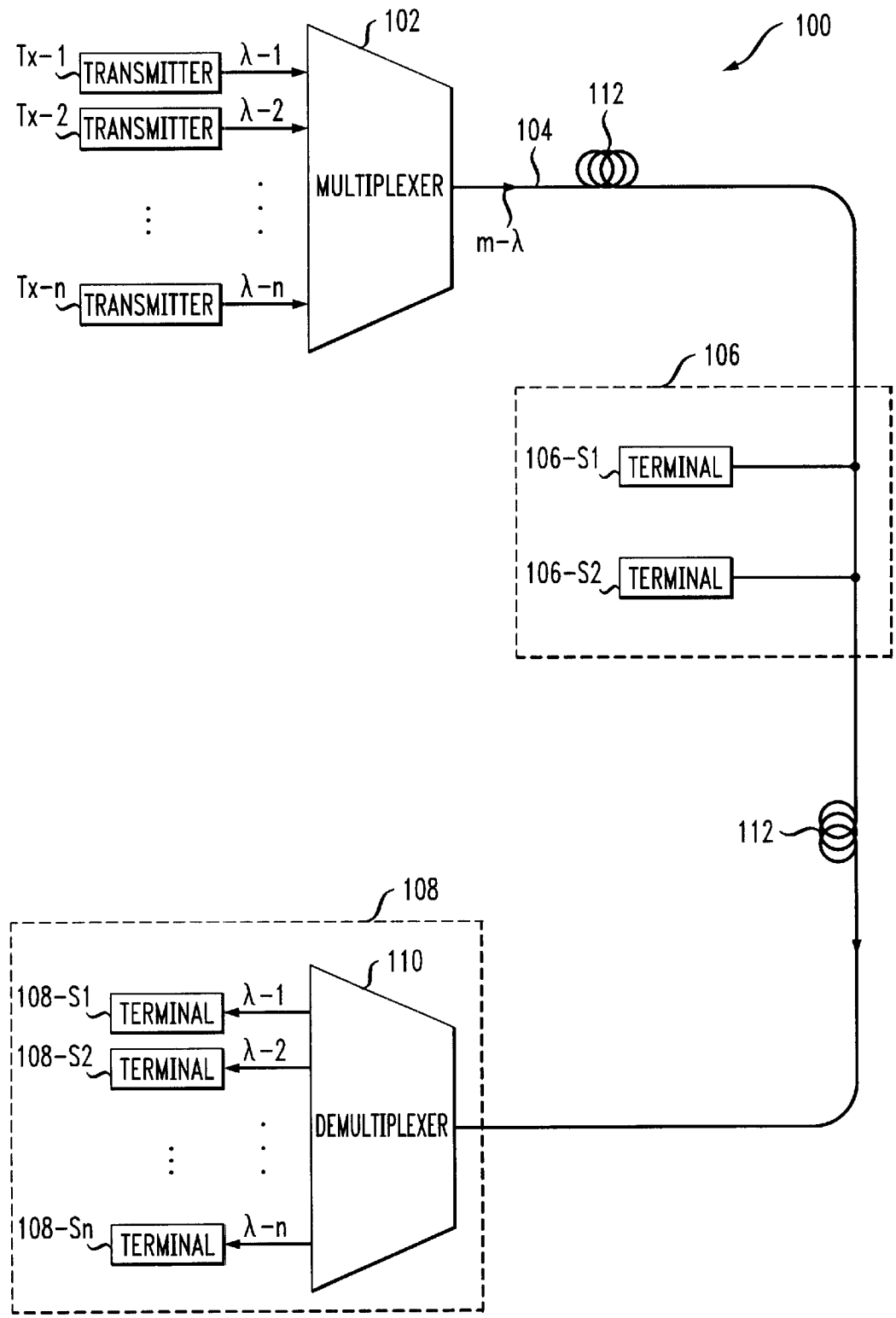
FIG. 1 depicts a conventional WDM network.
Figure 2:
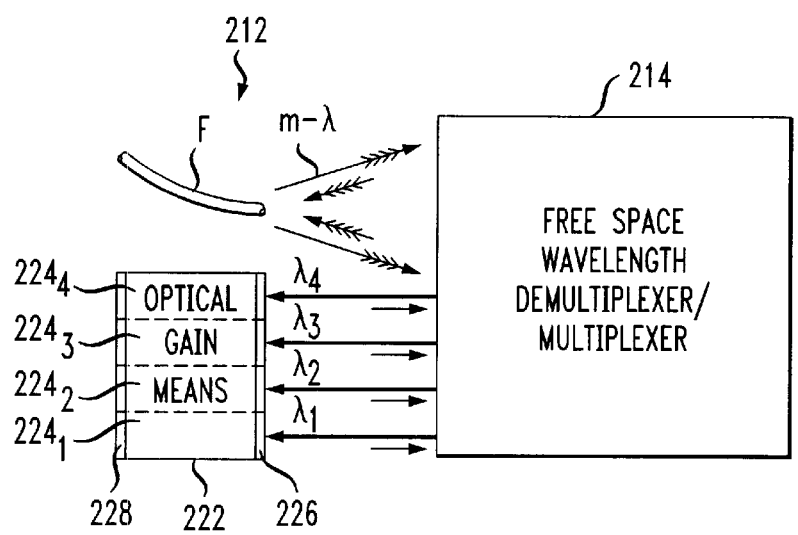
FIG. 2 depicts a first illustrative embodiment of a broad band optical amplifier in accordance with the present teachings.

FIG. 2 depicts an illustrative embodiment of a broadband amplifier 212 in accordance with the present teachings. In the illustrated embodiment, amplifier 212 comprises free-space wavelength demultiplexer/multiplexer 214 and optical gain means 222, interrelated as shown.

Free-space wavelength demultiplexer/multiplexer 214 is operable to receive a multiplexed signal m-λ from input/ output waveguide F, which may be, without limitation, single mode optical fiber. Demultiplexer/multiplexer 214 is further operable to demultiplex the received multiplexed signal into its constituent spectral components λ-i, i=1, n (where n=4 in the illustrated embodiment). Each spectral component λ-i is characterized by a different peak wavelength.

Optical gain means 222 comprises a plurality of "wavelength-specific" gain regions $224_i$ i=1, n, (where n=4 in the illustrated embodiment). As used herein, the phrase "wavelength-specific" refers to fact that an individual gain region $224_i$ is operable to impart gain to an optical signal having a specific peak wavelength (more accurately, to a narrow range of wavelengths that band that specific peak wavelength).

As each of the four illustrative spectral components λ-1 through λ-4 is characterized by a different peak wavelength, each of the four gain regions $224_1$ through $224_4$ is advantageously operative to impart gain over a different narrow band of wavelengths encompassing one of the peak wavelengths. In some embodiments of the present invention, free-space wavelength demultiplexer/multiplexer 214 is operable to deliver each spectral component λ-i, as a function of its wavelength, to the corresponding wavelength-specific gain region $224_i$. As a consequence, spectral components λ-1 through λ-4 are amplified in respective regions $224_1$ through $224_4$ of optical gain means 222.

In the illustrative embodiment shown in FIG. 2, four gain regions are depicted as is desirable for amplifying the four spectral components comprising multiplexed signal m-λ. It should be understood, however, that in other embodiments, optical gain means 222 comprises more than four wavelength-specific gain regions $224_i$ as is desirable for amplifying a greater number of optical signals. It should be understood that increasing the number of gain regions (each operative over a different range of wavelengths) increases the bandwidth of amplifier 212. Optical gain means 222, and gain regions $224_i$ are described in further detail later in this Specification.

The leading edge of optical gain means 222 comprises an anti-reflection coating 226, well known in the art, to improve signal coupling efficiency. And, in some embodiments, the trailing edge of optical gain means 222 includes a high reflection (HR) mirror 228. HR mirror 228 reflects amplified spectral components λ-1 through λ-4 toward free-space wavelength demultiplexer/multiplexer 214. It is within the capabilities of those skilled in the art to form anti-reflection coatings and HR mirrors.

As is well known, when signal propagation (direction) through a demultiplexer is reversed, the demultiplexer is operable to multiplex signals. That is, the demultiplexer becomes a multiplexer. Therefore, as amplified spectral components λ-1–λ-4 propagate through free-space wavelength demultiplexer/multiplexer 214 towards input/output waveguide F, they are re-multiplexed. Other than the imparted gain, the reconstituted version of multiplexed signal m-λ is identical to the original multiplexed signal.

In the illustrated embodiments, free space wavelength demultiplexer/multiplexer 214 is implemented as a grating demultiplexer/multiplexer. In an embodiment depicted in FIG. 3, a broad band amplifier includes a grating demultiplexer/multiplexer that is realized via collimating/ focusing optics 316 and plane grating 318, the operation of which is described below. Those skilled in the art will recognize that free space wavelength demultiplexer/ multiplexer 214 may be implemented in a manner other than as a grating demultiplexer/multiplexer, and that a grating demultiplexer may be implemented in a manner other than as collimating/focusing optics and a plane grating. Such other implementations may suitably be employed in other embodiments of the present invention.

Figure 3:
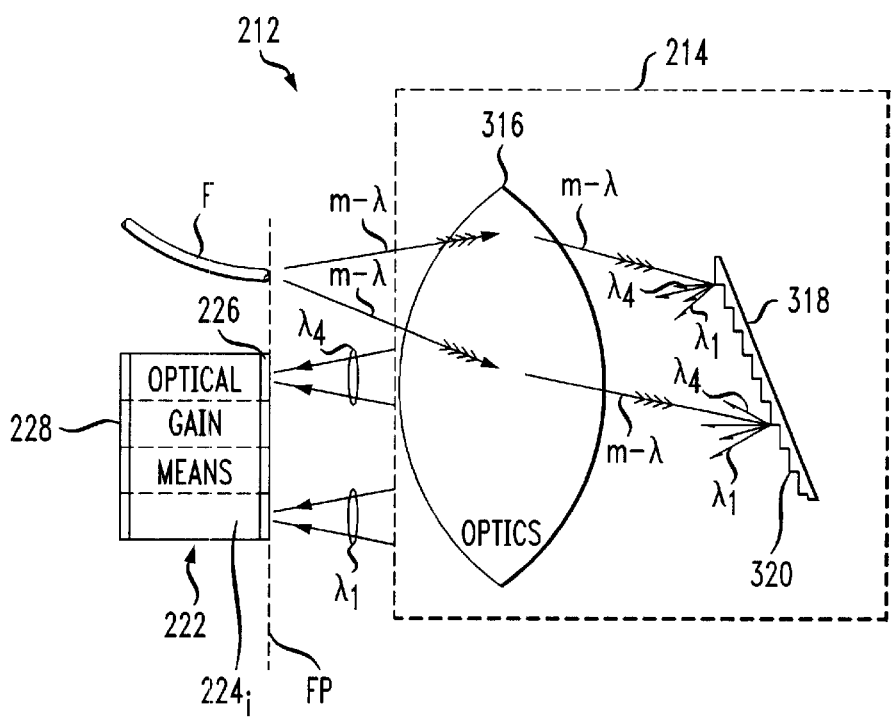
FIG. 3 depicts an illustrative embodiment of a free space wavelength demultiplexer/multiplexer in the broad band optical amplifier of FIG. 2.

As depicted in FIG. 3, multiplexed signal M-λ is delivered, via input/output fiber F, to collimating/focusing optics 316. Multiplexed signal m-λ is collimated via optics 316, which can be, without limitation, a graded index (GRIN) lens, a ball lens and a molded lens (e.g., injection molded lens). In one embodiment, optics 316 is a quarter-pitch GRIN lens, which is known to be the shortest length GRIN lens that will substantially collimate an optical signal.

The collimated multiplexed signal m-λ is received by grating 318, which is an optical surface that reflects light. The surface of grating 318 comprises a large number of grooves 320 that are operative to diffract incident light. As is well known, grating 318 has the property of diffracting light in a direction that is related to the wavelength of the light. Hence, when an incident beam comprising multiple wavelengths (e.g., multiplexed signal m-λ) is diffracted from grating 318, its various spectral components (e.g., λ-1 through λ-4) are angularly (spatially) separated. Those skilled in the art will be able to design and fabricate grating 318 using well-known relations for determining diffraction order angles, dispersion, grating resolution and like parameters. See J. P. Laude, Wavelength Division Multiplexing Prentice Hall International Series in Optoelectronics, 1993, pp. 37–52.

Spatially-separated spectral components λ-1 through λ-4 of multiplexed signal m-λ are received by optics 316. Since spectral components λ-1 through λ-4 remain collimated when diffracted from grating 318, they will be focused on a surface located at the Fourier plane FP (ie., the back focal plane of a lens) by optics 316. See, Goodman, *Introduction to Physical Optics*, Chapter 5, "Fourier Transforming and Imaging Properties of Lenses," (McGraw-Hill, 1968) for a mathematical treatment. Since the spectral components are spatially separated from one another, each spectral component λ-1 through λ-4 will be focused to a point at a different location at Fourier plane FP. That is, the location of focus for each spectral component λ-i is laterally shifted relative to the other spectral components.

In the embodiments depicted in FIGS. 2 and 3, the input and output to optical gain means 222 is advantageously disposed at Fourier plane FP. Moreover, the various wavelength-specific gain regions 224i are aligned with the location of focus (at Fourier plane FP) of the various spectral components λ-i. Furthermore, each gain region $224_i$ is located so that it receives a spectral component λ-i that has a peak wavelength that falls within its operating range. Thus, by the action of free-space wavelength demultiplexer/multiplexer 214, each gain region $224_i$ receives, with high coupling efficiency, a spectral component λ-i that has a wavelength that is within its range of operability.

Broad band amplifier 212 depicted in FIGS. 2 and 3 operates in a reflective mode, wherein, due to HR mirror 228, the spectral components traverse the same path (but in opposite directions) through the same elements both before and after amplification. In a further embodiment in accordance with the present teachings, broad band amplifier 412 operates in a transmissive mode, as depicted in FIG. 4.

Figure 4:
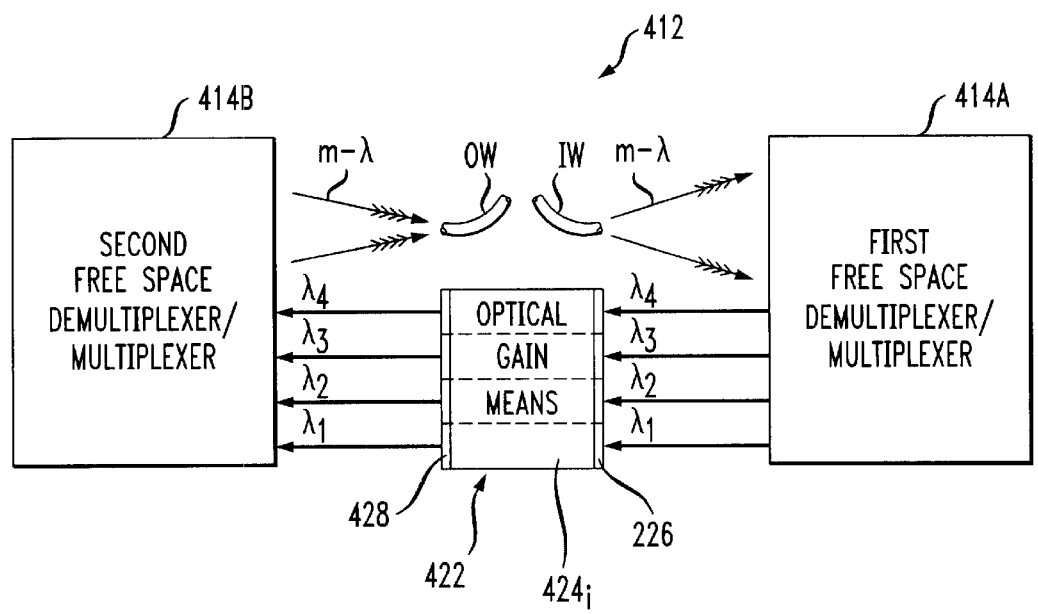
FIG. 4 depicts a second illustrative embodiment of a broad band optical amplifier in accordance with the present teachings.

Broad band amplifier 412 depicted in FIG. 4 comprises first free space wavelength demultiplexer/multiplexer 414A, optical gain means 422 and second free space wavelength demultiplexer/multiplexer 414B. First demultiplexer/multiplexer 414A demultiplexes multiplexed signal m-λ received from input waveguide IW and delivers spectral components λ-i, i=1, n to optical gain means 422 in the manner described above for amplifier 212. A HR mirror is not present at the trailing edge of each optical gain region $424_i$ of optical gain means 422, so the spectral components pass therefrom to second demultiplexer/multiplexer 414B. In some embodiments, a second anti-reflection coating 428 is disposed at the trailing edge of optical gain regions $424_i$.

Second demultiplexer/multiplexer 414B (re)multiplexes the spectral components into a single multiplexed signal and couples it to output waveguide OW.

Thus, first demultiplexer/multiplexer 414A and second demultiplexer/multiplexer 414B of illustrative broad band amplifier 412 do not perform "double duty" like demultiplexer/multiplexer 214 of amplifier 212. Specifically, first demultiplexer/multiplexer 414A of amplifier 412 demultiplexes multiplexed signal m-λ and second demultiplexer/multiplexer 414B of amplifier 412 multiplexes spectral components λ-i, i=1, n. It should be understood, however, that in at least some embodiments, first demultiplexer/multiplexer 414A is capable of multiplexing, and second demultiplexer/multiplexer 414B is capable of demultiplexing. This alternate function is not performed because the signal(s) makes only a forward pass through such components.

First and second free space wavelength demultiplexer/multiplexer 414 may suitably be implemented in the manner of free space wavelength demultiplexer/multiplexer 214 of amplifier 212 (e.g., as a grating demultiplexer/multiplexer).

Figure 5:
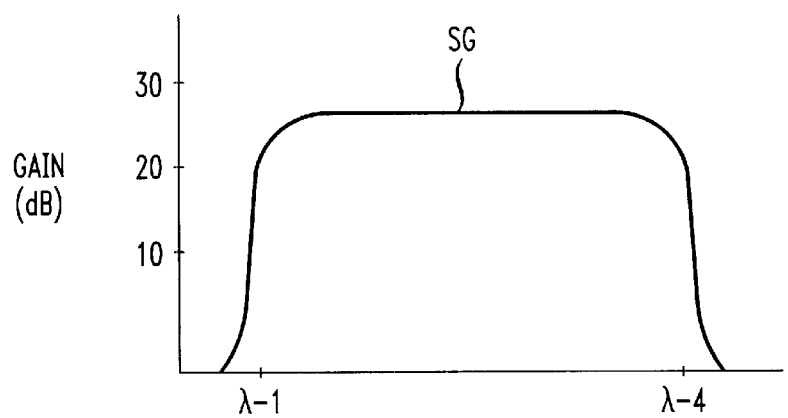
FIG. 5 depicts the expected performance of the present broad band optical amplifier.

Expected performance for illustrative broad band amplifiers 212 and 412 is depicted in FIG. 5, which shows a plot SG of signal gain in dB versus wavelength. As depicted in FIG. 5, a substantially uniform gain is obtained over a broad range of wavelengths. Optical amplifiers are typically driven by an external stimulus (e.g., current injection, etc.). Since the gain profile of each gain region $224_i$ will be different than the gain profile of every other gain region $224_i$, the external stimulus for each gain region should be suitably adjusted (via "trial and error") to provide the flat response depicted in FIG. 5.

In some embodiments, each gain region $224_i$ comprises a semiconductor optical amplifier. In a semiconductor optical amplifier, amplification is mediated by electronic transitions. More particularly, under external stimulus, typically current injection, electron transitions generate photons by stimulated (or spontaneous) emission. Stimulated emission occurs when a photon propagating through the semiconductor prompts an electron to undergo a transition and to emit a second photon identical to the first one. A single generated photon can give rise to significant numbers of clones, thereby growing the intensity of (i.e., imparting gain to) an optical field propagating through the semiconductor material.

The wavelength of the emitted photons is termed the (peak) "emission wavelength" of the semiconductor amplifier. Gain is imparted to an optical signal over a narrow range about the peak emission wavelength. The emission wavelength is determined by the dominant optical transitions that occur in the semiconductor material. In a bulk semiconductor, the dominant transitions are those from the conduction band to the valence band. The difference in energy between the conduction band minima and valence band maxima is known as the "energy band gap" or simply the "band gap" of a semiconductor material.

For quantum-well material, the emission wavelength is a function of the band gap, and also a function of an energy contribution that is termed the "quantum-confinement energy." The quantum-confinement energy is a measure of the energy difference for transitions between two quantum-well sub-bands. The quantum-confinement energy is a function of quantum-well width. Relative to bulk semiconductor amplifiers, quantum-well amplifiers allow more accurate tuning of the emission wavelength.

Figure 6:
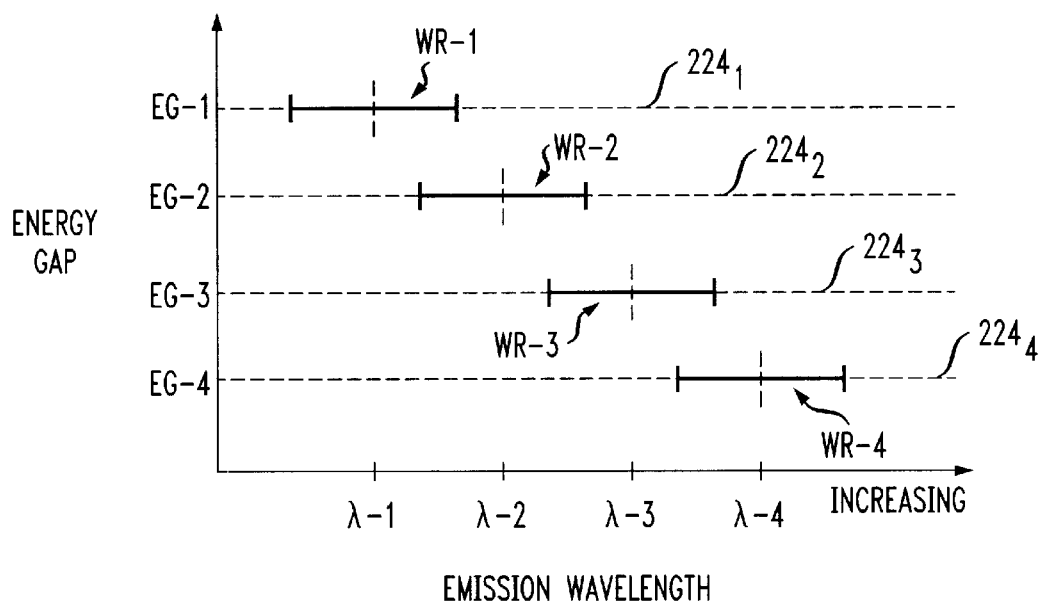
FIG. 6 depicts, via a plot of energy gap versus emission wavelength, the operation of gain regions for use in conjunction with the present invention.

So, in some embodiments, each gain region $224_i$ is characterized by a unique energy gap. As a consequence, a given gain region $224_i$ will emit photons having a peak emission wavelength that is different from every other gain region. This mode of operation is represented pictorially in FIG. 6, which depicts energy gaps EG-1 through EG-4 characteristic of the semiconductor material comprising respective gain regions $224_1$ through $224_4$.

Each gain region $224_i$ provides an acceptable level of gain (e.g., at least 15 dB) over a narrow band of wavelengths WR-i (e.g., about 10–30 nanometers). For example, gain region $224_1$ provides an acceptable level of gain for wavelengths in the range WR-1, etc. To the extent that a spectral component λ-i falls within the operating range of a gain region $224_i$, that gain region will amplify that particular spectral component. For example, the wavelength of spectral component λ-1 falls within range WR-1, so that spectral component λ-1 is amplified by gain region $224_1$.

Gain means 222 can be formed in any one of a variety of ways. For example, in one embodiment, gain means 222 comprises an array of discrete semiconductor amplifier chips, with each chip functioning as one or more of the gain regions. In another embodiment, gain means 222 is formed on a single chip.

The chip(s) comprise optical amplifiers and waveguides of well-known structure that are formed in well-known fashion (e.g., using molecular beam epitaxy, metalorganic vapor phase epitaxy, etc.) using either bulk semiconductor material or quantum well material. See, for example, H. P. Zappe, "Introduction to Semiconductor Integrated Optics," Artech House, Inc., 1995, Chapters 8, 9.

Each gain region comprises a semiconductor material that has an emission wavelength that is appropriate for imparting gain to the received signal(s). The semiconductor is typically a III–V alloy. For example, the quaternary alloy $In_{1-x}Ga_xAs_yP_{1-y}$ (grown on InP) is advantageously used for amplifying signals at telecommunications wavelengths (e.g. 1300 and 1550 nanometers, etc.).

Varying the composition of a III–V alloy changes its energy gap and refractive index. Thus, by regionally varying the composition of a III–V alloy that is deposited on a substrate, one region may be used for optical amplification and another region for waveguiding. Moreover, multiple optical amplifiers each characterized by a different energy gap and, hence, a different emission wavelength, can be formed on a substrate.

Figure 7:
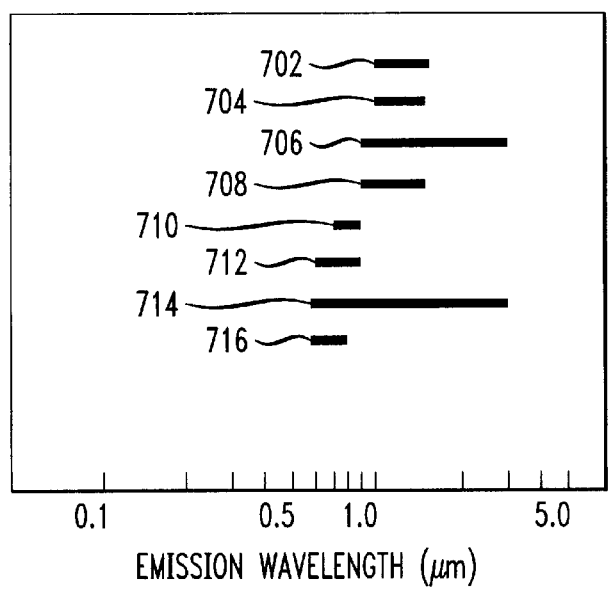
FIG. 7 depicts the emission wavelength for several important ternary and quaternary III–V alloys.

FIG. 7 depicts a plot of the emission wavelength ranges for several important III–V ternary and quaternary materials, identified as follows.

| Alloy No. | Alloy |
| --- | --- |
| 702 | $In_{1-x}Ga_xAs_yP_{1-y}$ |
| 704 | $GaAs_xSb_{1-x}$ |
| 706 | $InAs_xP_{1-x}$ |
| 708 | $(Al_xGa_{1-x})_y In_{1-y}As$ |
| 710 | $Al_xGa_{1-x}As$ |
| 712 | $GaAs_{1-x}P_x$ |
| 714 | $In_xGa_{1-x}As$ |
| 716 | $(Al_xGa_{1-x})_y In_{1-y}P$ |

Figure 8:
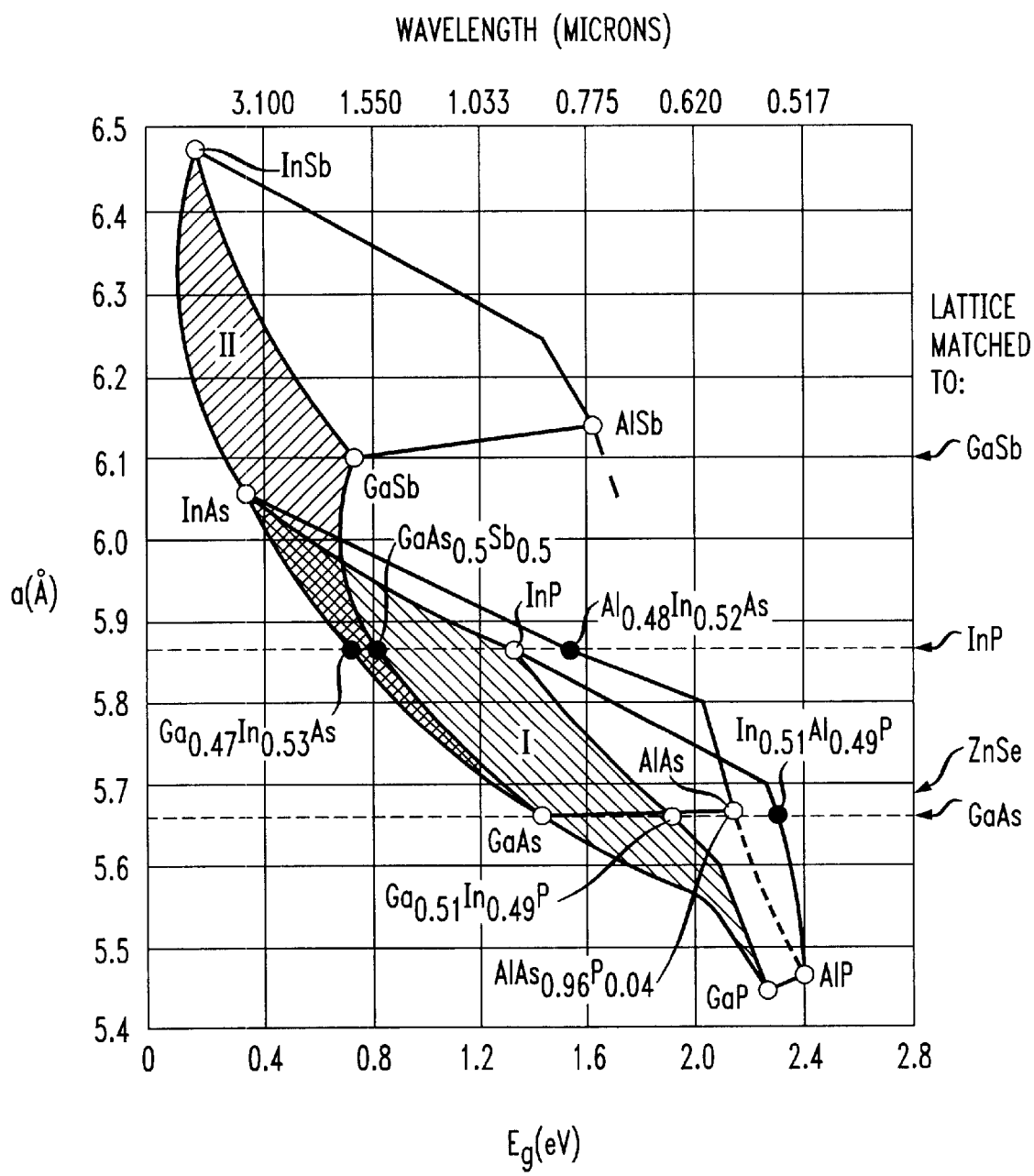
FIG. 8 depicts the lattice constant, energy gap, and emission wavelength for binary, ternary and quaternary III–V alloys.

FIG. 8 depicts a more complete plot of binary, ternary and quaternary III–V alloy compositions and the energy gap, lattice constant and emission wavelength for such compositions. Region I represents the quaternary alloy $Ga_x In_{1-x}As_yPb_{1-y}$ and region II represents the quaternary alloy $Ga_xIn_{1-x}As_ySb_{1-y}$.

It is within the capabilities of those skilled in the art to suitably select a III–V alloy of appropriate composition for forming gain and waveguiding regions for use in conjunction with the present invention using information such as that presented in FIGS. 7 and 8 and other readily available references. See, H. P. Zappe, cited above, Chapter 4; see also Swaminathan and Macrander, "Materials Aspects of GaAs and InP Based Structures," Prentice Hall, 1991, Chapter 1.

The various gain regions and waveguiding regions can be formed via "etch and regrow" methods. In such methods, the epitaxial layers required to form a first gain region having a first energy gap are formed over the whole substrate. Conditions (e.g., temperature, pressure and such materials used for the growth are selected so that the material that is deposited has the requisite characteristics. Those layers are then masked where the first gain region is to be formed, and unmasked regions are etched away. After etching, a layers corresponding to a second gain region, or a waveguiding region, as appropriate, are grown. The process is repeated, "etching" and "regrowing" as required to form structures suitable for accomplishing the desired photonic operations.

In some embodiments, the various gain regions $224_i$ and waveguiding regions are advantageously formed using a method called "selective growth" or "selective area epitaxy." Using selective area epitaxy, the energy gap of semiconductor material can be varied in the same plane with a single growth step as opposed to the multiple growth steps of "etch and regrow" methods. Thus, the layers defining the various gain regions $224_1$ through $224_4$ can be grown simultaneously.

To grow material via selective area epitaxy, a "masking" layer, typically comprising a dielectric (e.g., silicon oxide, silicon nitride, etc.), is deposited on a substrate. The masking layer is patterned into spaced strips or masks. Source material for forming the epitaxial layers, such as indium, gallium, arsenic and phosphorous, is typically delivered via metalorganic vapor phase epitaxial (MOVPE) methods. Source material arriving from the vapor phase will grow epitaxially in regions where the mask is open (i.e., the substrate is uncovered). Source material landing on the mask itself will not readily nucleate. Given the appropriate temperature and mask width, most of the source material that lands on the mask reenters the vapor phase and diffuses, due to the local concentration gradient, to land in an unmasked region.

Compared to a completely unmasked substrate, quantum-well growth that occurs in the gap for both InGaAs and InGaAsP epilayers will be thicker, and richer in indium. This effect is due to the relative diffusion coefficients of indium and gallium under typical MOVPE growth conditions. As the quantum well layers thicken, changes occur in the quantum-confined Stark effect resulting in longer wavelength (lower energy gap) quantum-well material. Thus, from both the quantum-size effect and change in alloy composition, the quantum wells in the gap are shifted to lower energy gaps than regions far from the mask. By varying the ratio of mask width to the gap (width), the composition, and the hence the energy gap of quantum-well material can be varied.

Figure 9:
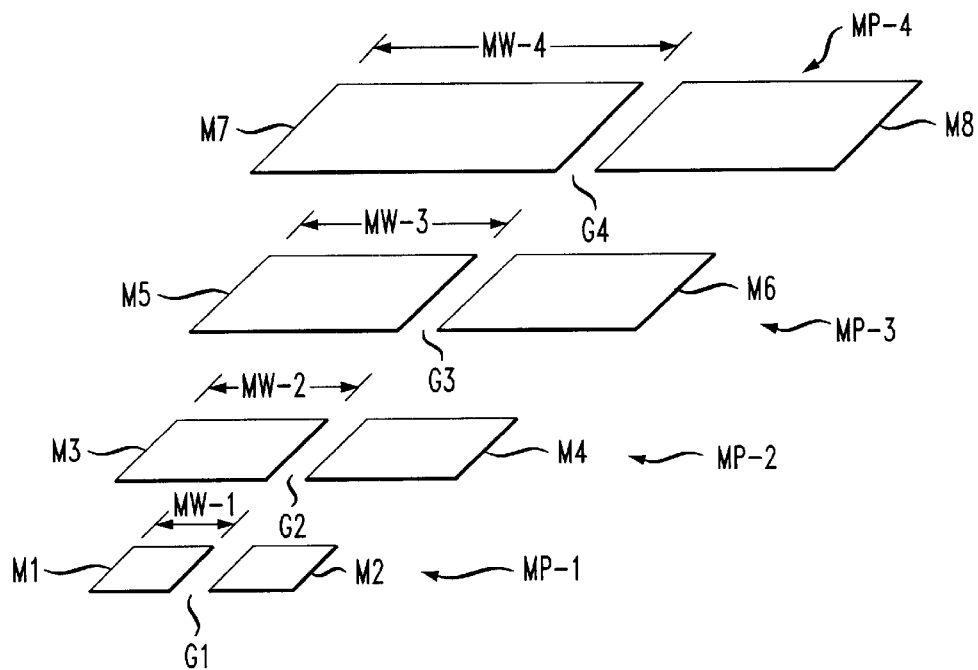
FIG. 9 depicts a mask arrangement for producing gain regions via selective area epitaxy.

Thus, to form gain means 222, a masking layer is deposited and patterned into a plurality of masks M-i, eight of which masks M-1 through M-8 are depicted in FIG. 9. Masks M-1 and M-2, which are separated by gap G-1, define mask pair MP-1 and masks M-3 and M-4, which are separated by gap G-2, defme mask pair MP-2. Masks M-5 and M-6, which are separated by gap G-3, define mask pair MP-3 and masks M-7 and M-8, which are separated by gap G-4, define mask pair MP-4. The quantum-well material grown in the gaps G-1 through G-4 will form gain regions $224_1$ through $224_4$.

Figure 10:
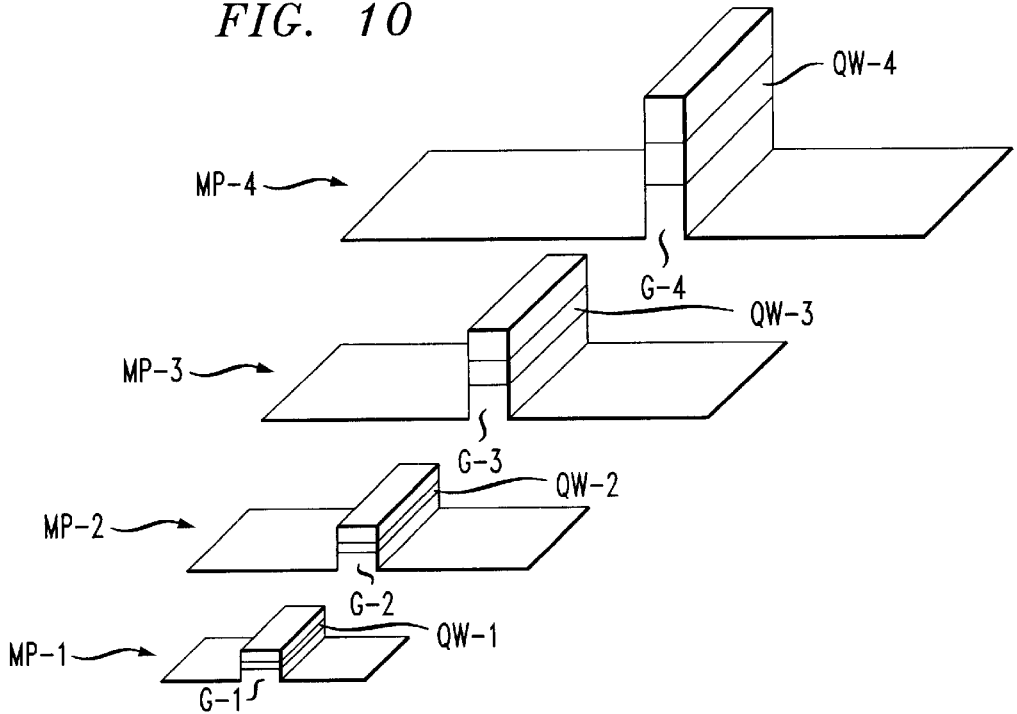
FIG. 10 depicts the growth of quantum well material in a gap between the masks of FIG. 9.

The masks defining each mask pair are characterized by a width, MW-j. Mask width MW-j increases as follows: MW-1<MW-2<M W-3<MW-4. As mask width MW-j increases, the quantum-well growth rate in the gap increases. Regions experiencing a relatively increased growth rate exhibit relatively thicker quantum wells. This phenomenon is depicted in FIG. 10, wherein QW-1<QW-2<QW-3<QW-4. As previously indicated, relatively thicker quantum wells are characterized by a relatively longer emission wavelength. In this manner, a plurality of gain regions $224_1$ through $224_4$ are formed each of which has a specific emission wavelength that is different from the emission wavelength of all other gain regions. For clarity of illustration, only one quantum well is depicted in the material grown in each of the gaps G-1 through G-4. Those skilled in the art will recognize that for the illustrative communications application (ie., a WDM network) the gain regions will typically comprise from about three to about ten quantum wells.

As previously described, adjacent spectral channels are physically separated at gain means 222 due to the action of free space wavelength demultiplexer/multiplexer 214. Thus, the region between adjacent gain regions $224_i$ and $224_{i+1}$ will not receive one of the demultiplexed spectral components. Such regions are therefore advantageously optically-opaque to spectral components λ-i. This may be accomplished by appropriately adjusting mask width, or, depending upon conditions, leaving such regions unmasked in known fashion.

As those skilled in the art will recognize, it may be advantageous to deposit a guiding layer (not shown) beneath the gain regions $224_i$. Such a guiding layer provides waveguiding in the vertical direction. Thus, in some embodiments, a guiding layer of a III–V alloy, such as indium-gallium-arsenide-phosphide, is suitably deposited on a substrate before the masking layer is deposited. The guiding layer is deposited using, for example, MOVPE. A bulk homogenous layer of proper thickness and refractive index would also be suitable for use as a guiding layer.

An additional layer is advantageously deposited on top of the guiding layer. Such a layer dictates the mode confinement factor of the waveguide. The additional layer may be any alloy composition that has a lower refractive index than the guiding layer. In one embodiment, the additional layer comprises undoped indium phosphide.

Those skilled in the art will be able to fabricate gain means 222 as described above via selective area epitaxy. See, U.S. Pat. No. 5,418,183; Joyner et al., "Extremely Large Band Gap Shifts for MQW Structures by Selective Epitaxy on $SiO_2$ Masked Substrates," IEEE Phot. Tech. Letts. 4(9), (September 1992), pp. 1007–1009; Eckel et al., "Improved Composition Homogeneity During Selective Area Epitaxy of GaInAs Using a Novel In Precursor," Appl. Phys. Letts., 64(7), (February 1994), pp. 8564–856; Kato et al., "DFB-LD/Modulator Integrated Light Source by Band-Gap Energy Controlled Selective MOVPE," Elect. Letts., 28(2), (January 1992), pp. 153–154; Thrush et al., "Selective and Non-Planar Epitaxy of InP, GaInAs and GaInAsP Using Low Pressure MOCVD," J. Cryst. Growth, v. 124, (1992), pp. 249–254; Zirngibl et al., "Digitally Tunable Laser Based on the Integration of a Waveguide Grating Multiplexer and an Optical Amplifier," IEEE Phot. Tech. Letts., 4(6), (April 1994), p. 516–518.

In a further embodiment, as an alternative to selective area epitaxy, quantum-well intermixing is used to provide a plurality of gain regions having a different emission wavelength. Quantum-well intermixing provides for a selective shift of the emission wavelength by controlled interdiffusion of the quantum wells after growth. This technique is also referred to as "compositional disordering." See, H. P. Zappe, cited above, pp. 332–334.

As appropriate, improved optical communications networks in accordance with the present teachings may suitably include, a "broad band" pre-amplifier, a "broad band" in-line amplifier and a "broad band" post amplifier. All of such "broad band" amplifiers are configured in accordance with the illustrative embodiments of the present invention described herein.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

We claim:

1. A broadband optical amplifier comprising:
   a first free space diffraction grating operating to receive a multiplexed optical signal and separate it into its spectral components along a first direction; and
   an optical gain means having a plurality of adjacent wavelength-specific gain regions, said diffraction grating and optical gain means arranged such that each spectral component of the multiplexed signal is spatially mapped along said first direction onto a different wavelength-specific gain region of said optical gain means, with each adjacent wavelength-specific gain region providing selective gain for the corresponding spectral component of the multiplexed optical signal incident thereon.

2. The broadband optical amplifier of claim 1 wherein said diffraction grating is a plane diffraction grating.

3. The broadband optical amplifier of claim 1 further comprising an optical fiber for delivering the multiplexed optical signal to said diffraction grating.

4. The broadband optical amplifier of claim 1 further comprising means for focusing the spectral components of the multiplexed optical signal onto the adjacent wavelength-specific gain regions of said optical gain means.

5. The broadband optical amplifier of claim 1 wherein a leading edge of each of said wavelength-specific gain regions is disposed at the Fourier plane of said means for focusing.

6. The broadband optical amplifier of claim 1 further comprising a high reflectivity mirror that is operable to reflect the spectral components of said multiplexed optical signal towards said first free space diffraction grating after said spectral components have made at least one pass through said wavelength-specific gain regions.

7. The broadband optical amplifier of claim 1 further comprising a second free space diffraction grating for multiplexing the spectral components of said multiplexed optical signal.

8. The broadband optical amplifier of claim 1 wherein said adjacent wavelength-specific gain regions comprise semiconductor optical amplifiers.

9. A method for amplifying a multiplexed optical signal comprising:
   separating the multiplexed optical signal into its spectral components such that the spectral components are uniquely spatially mapped to adjacent wavelength-specific regions within an optical gain means; and within each wavelength-specific gain region, selectively providing gain for the corresponding spectral component of the multiplexed optical signal incident thereon.

10. The method of claim 9 further comprising multiplexing in free space the spectral components of the multiplexed optical signal.

11. The method of claim 10 further comprising reflecting said amplified spectral components along a second path that coincides with a first path traversed by the spectral components after they are spatially mapped and before amplification, but said second path is in a reverse direction with respect to said first path.

12. The method of claim 10 wherein the step of multiplexing further comprises transmitting said amplified spectral components through said wavelength-specific gain regions and out of ends thereof.

13. The method of claim 9 further comprising the step of propagating said spectral components of the multiplexed optical signal through optics operable to focus said spectral components at a Fourier plane of said optics.

14. The method of claim 9 wherein the step of amplifying further comprises applying current to each of said wavelength-specific gain regions.

15. The method of claim 14 wherein the step of amplifying further comprises adjusting the current applied to each of said wavelength-specific gain regions to provide a flat gain profile across a range of wavelengths.

* * * * *